United States Patent
Tsukiji et al.

(10) Patent No.: US 6,950,452 B2
(45) Date of Patent: Sep. 27, 2005

(54) SEMICONDUCTOR LASER MODULE AND METHOD FOR SIMULTANEOUSLY REDUCING RELATIVE INTENSITY NOISE (RIN) AND STIMULATED BRILLOUIN SCATTERING (SBS)

(75) Inventors: Naoki Tsukiji, Tokyo (JP); Junji Yoshida, Tokyo (JP); Toshio Kimura, Tokyo (JP); Souko Kado, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 126 days.

(21) Appl. No.: 10/251,835

(22) Filed: Sep. 23, 2002

(65) Prior Publication Data

US 2003/0067952 A1 Apr. 10, 2003

(30) Foreign Application Priority Data

Sep. 28, 2001 (JP) ........................................ 2001-304510

(51) Int. Cl.[7] ........................... H01S 3/13; H01S 3/098; H01S 5/00; H01S 3/08
(52) U.S. Cl. ...................... 372/29.021; 372/18; 372/19; 372/43; 372/101; 372/108
(58) Field of Search .............................. 372/43, 19, 18, 372/29.021, 101, 102, 108

(56) References Cited

U.S. PATENT DOCUMENTS 6,384,963 B2   5/2002   Ackerman et al.

2002/0048300 A1 *  4/2002  Tsukiji et al. .................. 372/43
2002/0080833 A1 *  6/2002  Matsuura et al. ............. 372/20

* cited by examiner

*Primary Examiner*—Minsun Oh Harvey
*Assistant Examiner*—Armando Rodriguez
(74) *Attorney, Agent, or Firm*—Oblon, Spivak, McClelland, Maier & Neustadt, P.C.

(57) ABSTRACT

A semiconductor laser module including a semiconductor laser device having an integrated diffraction grating configured to output a multiple mode laser beam in the presence of a driving current, an optical fiber configured to guide the multiple mode laser beam to an output of the laser module, and an optical attenuation device configured to attenuate the multiple mode laser beam by an amount sufficient to provide a predetermined output power from the output of the laser module. The optical attenuation device may be an optical coupling lens offset from an optimum coupling position by an amount sufficient to provide the predetermined output power, or an optical attenuator interrupting the optical fiber and configured to attenuate the multiple mode laser beam by an amount sufficient to provide the predetermined output power. Also, a two fiber Raman amplifier having a super large area (SLA) fiber that provides amplification of the signal based primarily on the forward excitation light can also be used to suppress SBS.

13 Claims, 21 Drawing Sheets

3200 μm ≧ L ≧ 800 μm

3200 μm ≥ L ≥ 800 μm

| | Wavelength | Backward | Bi-directional | |
|---|---|---|---|---|
| | | | Forward | Backward |
| $\lambda_1$ | 1426.2 nm | 149 mW | 31 mW | 96 mW |
| $\lambda_2$ | 1438.5 nm | 161 mW | 36 mW | 108 mW |
| $\lambda_3$ | 1451.8 nm | 91 mW | 22 mW | 65 mW |
| $\lambda_4$ | 1466.0 nm | 83 mW | | 105 mW |
| $\lambda_5$ | 1495.2 nm | 184 mW | | 206 mW |
| Total power | | 668 mW | 668 mW | |

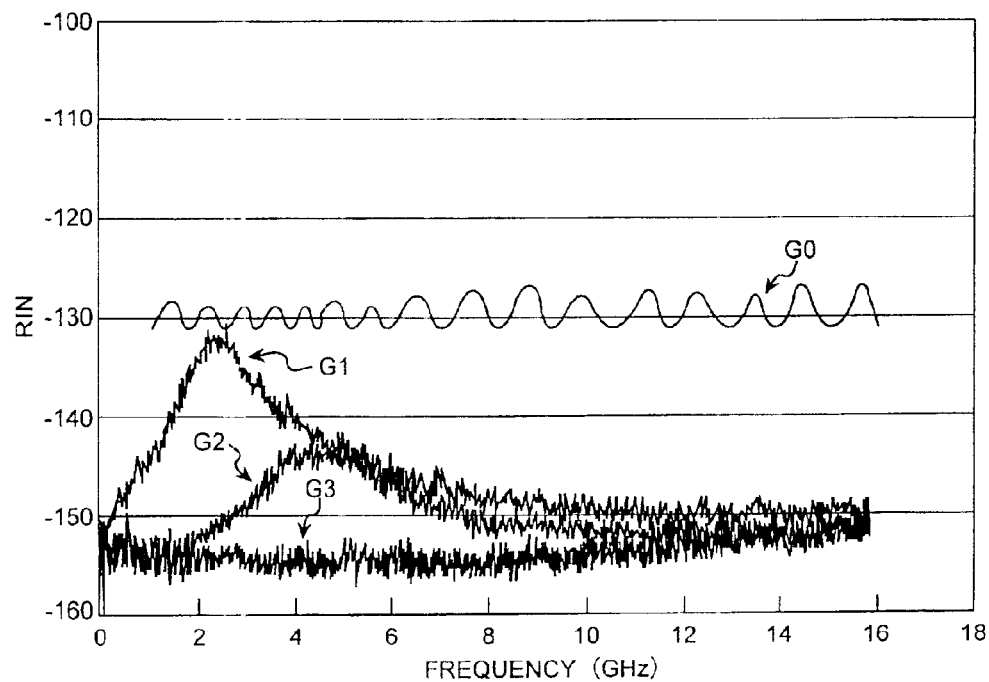
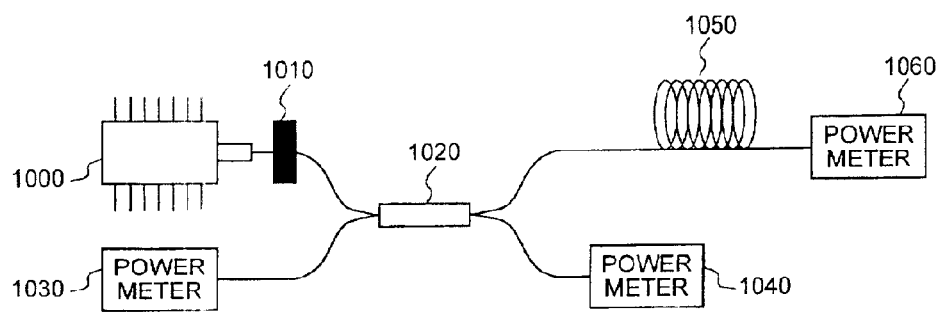

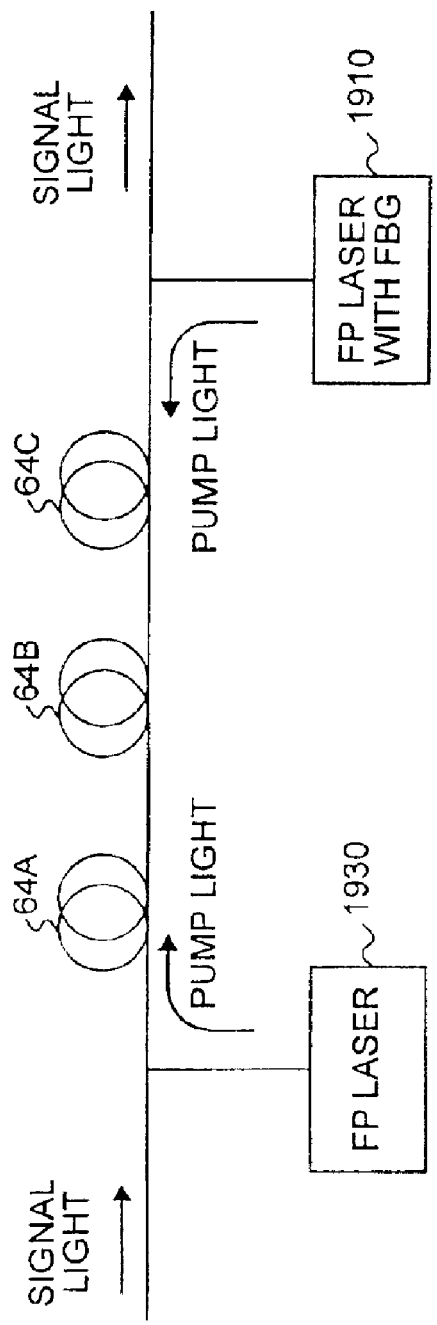

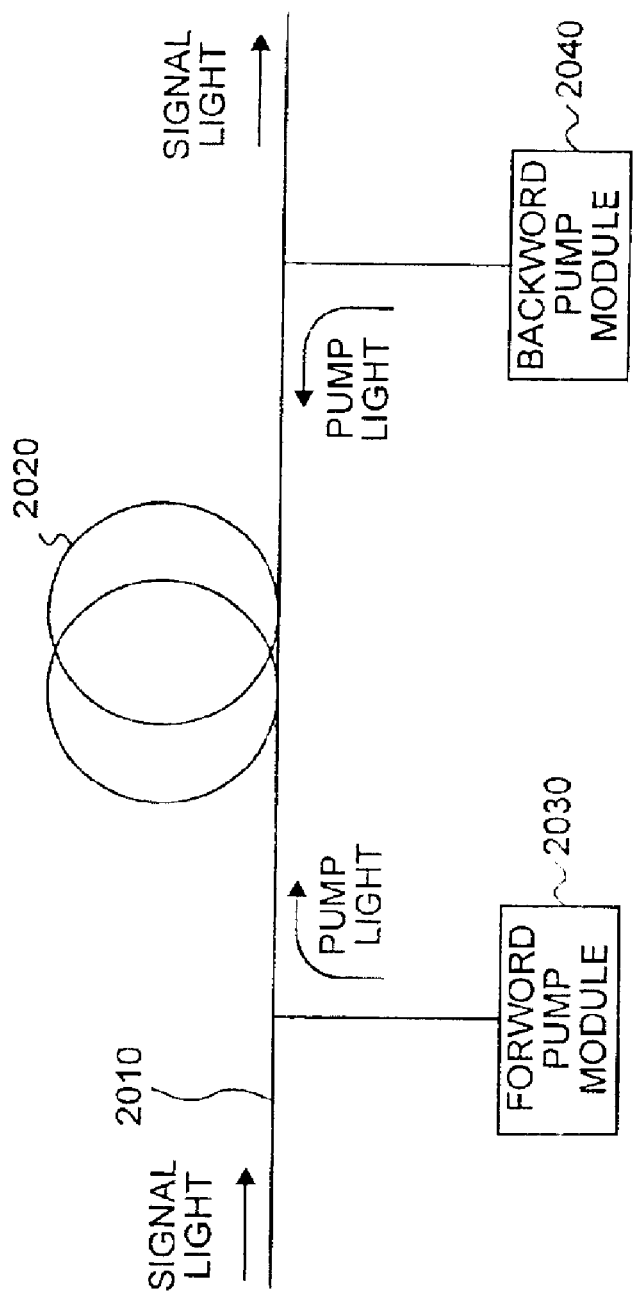

SEMICONDUCTOR LASER MODULE AND METHOD FOR SIMULTANEOUSLY REDUCING RELATIVE INTENSITY NOISE (RIN) AND STIMULATED BRILLOUIN SCATTERING (SBS)

CROSS REFERENCE TO RELATED APPLICATIONS

This application contains subject matter related to U.S. patent application Ser. No. 09/832,885 filed on Apr. 12, 2001, Ser. No. 09/983,175 filed on Oct. 23, 2001, Ser. No. 09/983,249 filed on Oct. 23, 2001. The entire content of each of these applications is incorporated herein by reference.

FIELD OF THE INVENTION

The present invention relates generally to semiconductor laser module, and in particular to a semiconductor laser module used as a pumping source for an optical amplifier.

BACKGROUND OF THE INVENTION

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route, which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped Fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam (The pumping wavelength is approximately 100 nm shorter than the signal wavelength which is typically in the vicinity of 1500 nm.) Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

For the EDFA and Raman amplifiers, it is desirable to have a high output laser device as a pumping source. This is particularly important for the Raman amplifier, which amplifies signals over a wide wavelength band, but has relatively small gain. Such high output is generally provided by a pumping source having multiple longitudinal modes of operation. The Furukawa Electric Co., Ltd. has recently developed an integrated diffraction grating device that provides a high output multiple mode laser beam suitable for use as a pumping source in a Raman amplification system. An integrated diffraction grating device, as opposed to a conventional fiber Bragg grating device, includes the diffraction grating formed within the semiconductor laser device itself. Examples of multiple mode oscillation integrated diffraction grating devices are disclosed in U.S. patent application Ser. No. 09/832,885 filed Apr. 12, 2001, Ser. No. 09/983,175 filed on Oct. 23, 2001, and Ser. No. 09/983,249 filed on Oct. 23, 2001, assigned to The Furukawa Electric Co., Ltd. and the entire contents of these applications are incorporated herein by reference.

As disclosed in the Ser. Nos. 09/832,885, 09/983,175, and 09/983,249 patent applications, an integrated diffraction grating multiple mode laser device provides a high output power, while reducing relative intensity noise (RIN) below levels found in fiber Bragg grating devices. As also described in these applications, a pump laser module having an integrated grating multiple mode laser device may be used as a forward pump, backward pump, or bi-directional pump module in a Raman amplifier. FIG. 20 is a block diagram illustrating the various pumping configurations of a pump module in a Raman amplifier. As seen in this figure, a signal light is injected into an optical fiber 2010 and propagates down the fiber 2010 to an optical amplifier 2020. As also seen in the figure, a co-propagating pump light is introduced to the fiber 2010 from a forward pump module 2030, while a counter-propagating pump light is introduced to the fiber 2010 from a backward pump module 2040. The forward pump module 2030 and the backward pump module 2040 may be used alone or in combination to provide an excitation source for the optical amplifier 2020. However, the present inventors have discovered that, despite the reduced RIN of the integrated diffraction grating multiple mode pump module, using such a module in the forward excitation system causes undesirable stimulated Brillouin Scattering (SBS) to occur.

SUMMARY OF THE INVENTION

Accordingly, one object of the present invention is to provide an integrated diffraction grating pump module and method suitable for use as a forward pumping light source in a Raman amplification system, but which overcomes the above described problems.

Another object of the present invention is to provide an integrated diffraction grating pump module that provides reduced RIN, while also avoiding SBS.

According to a first aspect of the present invention, a semiconductor laser module and method for providing a light source suitable for use as a forward pumping light source in a Raman amplification system are provided. The module upon which the method is based includes a semiconductor laser device having an integrated diffraction grating configured to output a multiple mode laser beam in the presence of a driving current, an optical fiber configured to guide the multiple mode laser beam to an output of the laser module, and an optical attenuation device configured to attenuate the multiple mode laser beam by an amount sufficient to provide a predetermined output power from the output of the laser module.

The optical attenuation device may be an optical coupling lens offset from an optimum coupling position by an amount sufficient to provide the predetermined output power, or an optical attenuator interrupting the optical fiber and configured to attenuate the multiple mode laser beam by an amount sufficient to provide the predetermined output power. The optical coupling lens may be a lens offset from the optimum coupling position in at least one of a direction of an optical axis of the laser beam and a direction perpendicular to the optical axis, but preferably is substantially offset from the optimum coupling position only in a direction of the optical axis.

In one aspect of the invention, the driving current of the semiconductor laser device may be at least 50 mA, at least 100 mA, or at least 150 mA. In another aspect of the invention, the semiconductor laser device of the laser module includes a laser device with the driving current being a predetermined current sufficient to reduce relative intensity noise (RIN) of the laser module. In this aspect, the optical attenuation device includes a device configured to attenuate the multiple mode laser beam by an attenuation amount sufficient to provide the predetermined output power at a power level that is sufficient to avoid stimulated Brillouin scattering (SBS) in a signal fiber that the output power is injected into. Moreover, the optical attenuation device may be a device configured to provide an attenuation amount corresponding to the predetermined current, or the semiconductor laser device having a cavity length of no more than 800 µm.

In yet another aspect of the present invention, an optical fiber amplifier, Raman amplifier, and wavelength division multiplexing system are provided with the semiconductor laser module described above. In one embodiment of this aspect, a Raman amplifier includes a signal fiber configured to carry a signal light, a super large area (SLA) amplifying fiber coupled to the signal fiber, and a second amplifying fiber coupled to the signal fiber downstream from the SLA amplifying fiber in a direction of propagation of the signal light. A first semiconductor laser module provides a forward excitation light to the first amplifying fiber, and a second semiconductor laser module provides a backward excitation light to the second amplifying fiber. The first pump module may be an integrated diffraction grating module, while the second pump module is a Fiber Bragg grating module. The SLA fiber has a relatively high stimulated Brillouin scattering (SBS) threshold in order to suppress Brillouin scattering of the forward excitation light.

In this embodiment, the Raman amplifier can use a semiconductor laser module without an attenuation mechanism. Moreover, the SLA fiber may have a predetermined length sufficient to attenuate the forward excitation light to a level below an SBS threshold of the second amplification fiber, and the second amplification fiber may be an inverse dispersion fiber configured to compensate for dispersion in the SLA fiber. An additional SLA fiber may be positioned between the inverse dispersion fiber (IDF) and second pump module, in which case the first and second pump modules are integrated fiber Bragg grating modules.

In yet another embodiment, the forward pump module may be removed and a backward pump module is an integrated diffraction grating multiple mode laser. An inverse dispersion fiber is disposed towards a side of an incoming signal light, and a super large area fiber is disposed towards the backward pump module.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a graph showing an RIN characteristic of a conventional FBG module and the semiconductor laser module according to the first embodiment at different drive currents;

FIG. 10A is a block diagram showing the test setup used to measure the effect of attenuation on SBS;

FIG. 19B is a block diagram illustrating a configuration of a conventional three amplifying fiber Raman amplifier used in a WDM communication system;

FIG. 20 is a block diagram illustrating the various pumping configurations of a pump module in a Raman amplifier.

DESCRIPTION OF THE PREFERRED EMBODIMENTS

Figure 1:
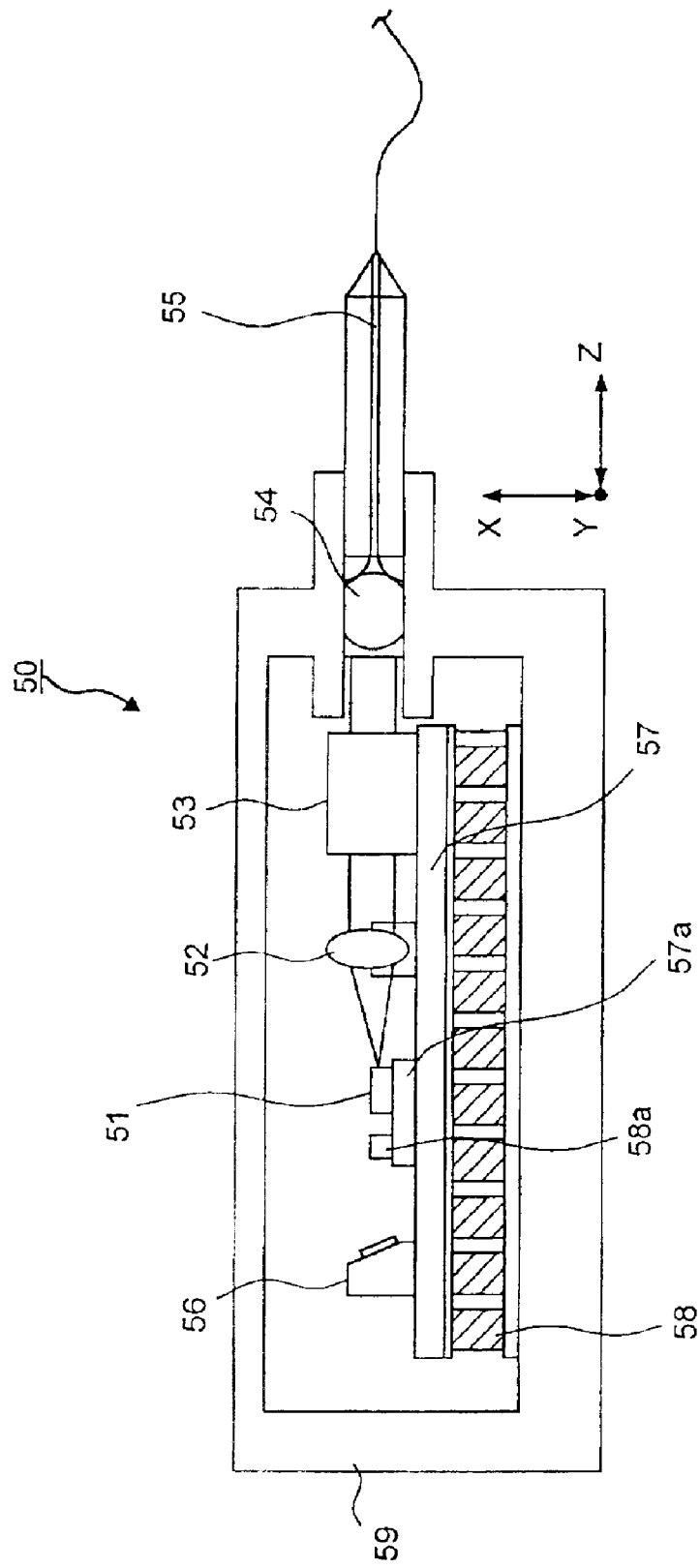
FIG. 1 is a vertical sectional view illustrating the configuration of a semiconductor laser module according to a first embodiment of the present invention.

Referring now to the drawings wherein like elements are represented by the same reference designation throughout, and more particularly to FIG. 1 thereof, there is shown a semiconductor laser module for providing a light source suitable for use as a forward pumping light source in a Raman amplification system, in accordance with the present invention. FIG. 1 is a vertical sectional view illustrating the configuration of a semiconductor laser module according to a first embodiment of the present invention. The semiconductor laser module 50 includes a semiconductor laser device 51, a first lens 52, an internal isolator 53, a second lens 54 and an optical fiber 55. A laser beam irradiated from the semiconductor laser device 51 is guided to optical fiber 55 via first lens 52, internal isolator 53, and second lens 54. The second lens 54 optically couples the laser 51 to the fiber 55 and is provided offset from an optimum position in order to provide a predetermined coupling efficiency as will be further described below.

The semiconductor laser device 51 is an integrated diffraction grating multiple mode laser device and is preferably provided in a junction down configuration in which the p-side electrode is joined to the heat sink 57a, which is mounted on the base 57. A back face monitor photo diode 56 is also disposed on a base 57 which functions as a heat sink and is attached to a temperature control device 58 mounted on the metal package 59 (Cu—W alloy, for example) of the laser module 50. The back facet monitor photo diode 56 acts as a current monitor to detect a light leakage from the reflection coating side of the semiconductor laser device 51.

The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Figure 2:
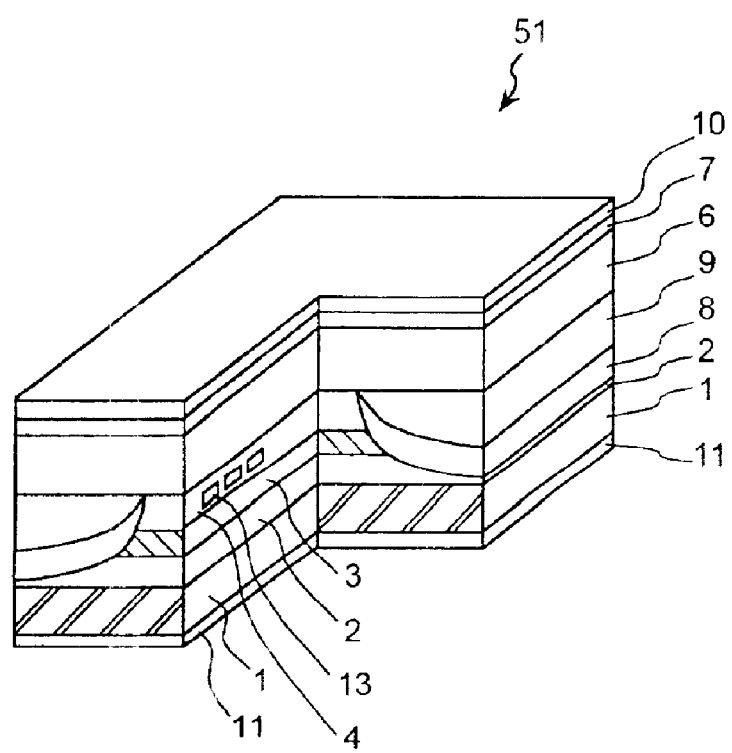
FIG. 2 is a cutaway view of a semiconductor laser device used in a laser module according to an embodiment of the present invention.
Figure 3:
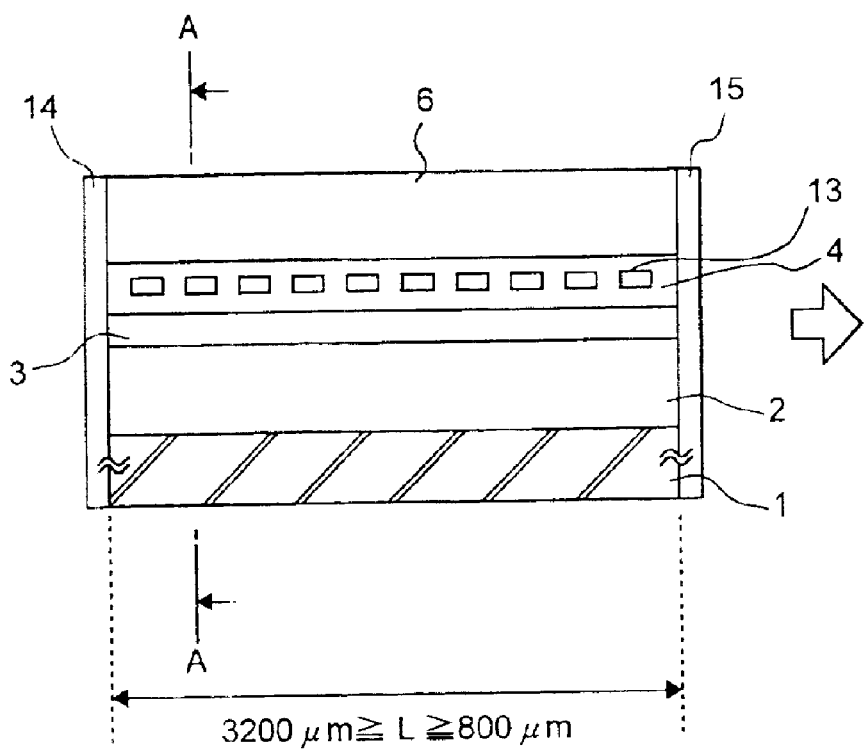
FIG. 3 is a vertical sectional view in the longitudinal direction of the semiconductor laser shown in FIG. 2.
Figure 4:
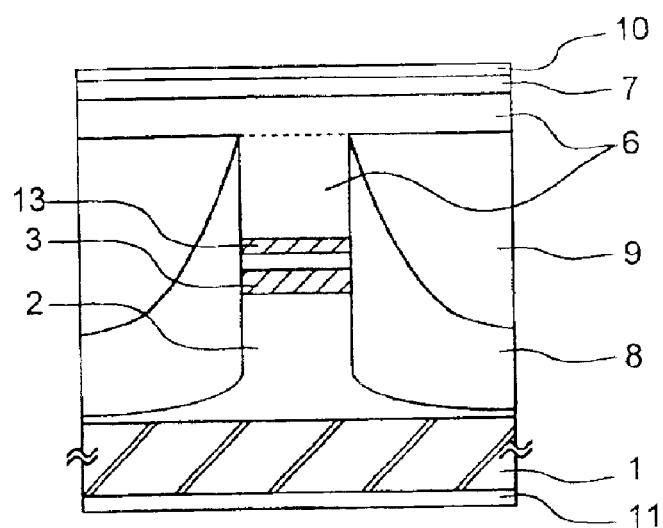
FIG. 4 is a cross sectional view along the line A—A of the semiconductor laser device shown in FIG. 3.

As noted above, the semiconductor laser device 51 is an integrated diffraction grating multiple mode laser device. FIGS. 2 through 4 show an integrated diffraction grating multiple mode laser device 51 used in a laser module 50 in accordance with the present invention. FIG. 2 is a cutaway view of the semiconductor device, FIG. 3 is a vertical sectional view in the longitudinal direction of the semiconductor laser device, and FIG. 4 is a cross sectional view of the semiconductor laser device, taken along the line A—A in FIG. 3. The semiconductor laser device 51 of FIGS. 2 through 4 includes an n-InP substrate 1 having an n-InP buffer layer 2, an active layer 3, a p-InP spacer layer 4, a p-InP cladding layer 6, and a P-InGaAsP contact layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW) structure. A diffraction grating 13 of a p-InGaAsP material is periodically formed within the p-InP spacer layer 4 substantially along the entire length of active layer 3. Finally, a p-side electrode 10 is formed on the upper surface of p-InGaAsP cap layer 7, and an n-side electrode 11 is formed on the back surface of n-InP substrate 1.

As seen in FIG. 3, reflective film 14 having high reflectivity of, for example, 80% or more, and preferably 98% or more is formed on a light reflecting end surface that is one end surface in the longitudinal direction of the semiconductor laser device 51. Antireflection coating 15 having a low reflectivity of, for example, less than 5%, less than 1%, or less than 0.5%, and most preferably less than 0.1% is formed on a light irradiating end surface opposing the light reflecting end surface of semiconductor laser device 51. The reflective film 14 and the antireflection coating 15 form an optical resonator within the active region 3 of the semiconductor laser device 51. A light beam generated inside the GRIN-SCH-MQW active layer 3 of the light resonator is reflected by the reflective film 14 and irradiated as an output laser beam via the antireflection coating 15, while being selected by the diffraction grating 13. Moreover, as best seen in FIG. 4, the p-InP spacer layer 4 having the diffraction grating 13, the GRIN-SCH-MQW active layer 3, and the upper part of the n-InP buffer layer 2 are processed in a mesa stripe shape. The sides of the mesa stripe are buried by a p-InP blocking layer 8 and an n-InP blocking layer 9 formed as current blocking layers.

Figure 5:
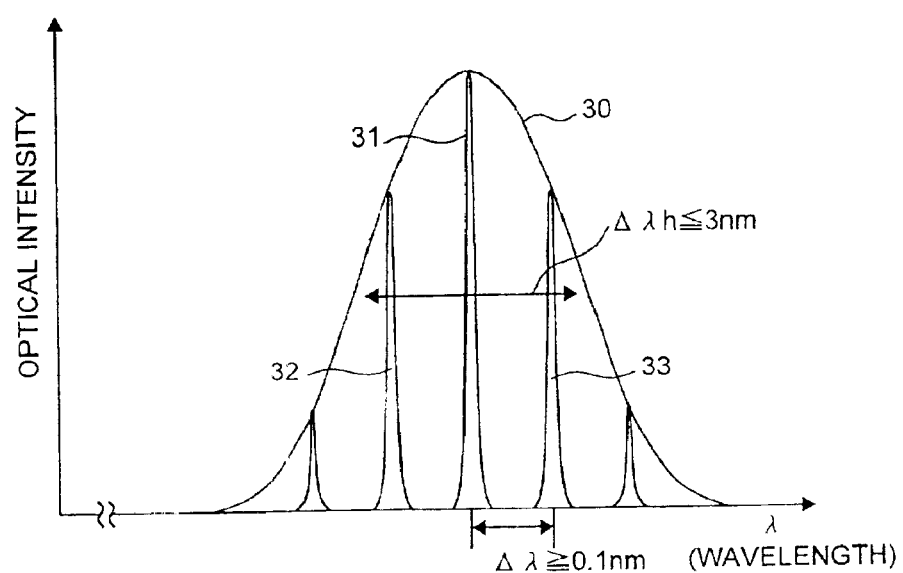
FIG. 5 is an oscillation wavelength spectrum of a laser device used in a laser module in accordance with the present invention.

The laser device 51 of FIGS. 2–4 is constructed so as to provide multiple longitudinal mode oscillation of the laser device. Thus, as seen in FIG. 3, the resonator length L is preferably from 800–3200 microns as described in U.S. patent application Ser. No. 09/832,885 which is incorporated herein by reference. FIG. 5 shows the oscillation wavelength spectrum of the light output of a diffraction grating semiconductor laser device in accordance with the present invention. As seen in this figure, the oscillation wavelength spectrum 30 provides multiple longitudinal modes including center frequency mode 31, and modes 32 and 33, separated by a wavelength interval $\Delta\lambda$. As also seen in FIG. 5, the wavelength interval $\Delta\lambda$ is preferably in the range of 0.1 nm to 3 nm. The oscillation wavelength spectrum 30 determines the output wavelength of the laser device.

Figures 6, 7:
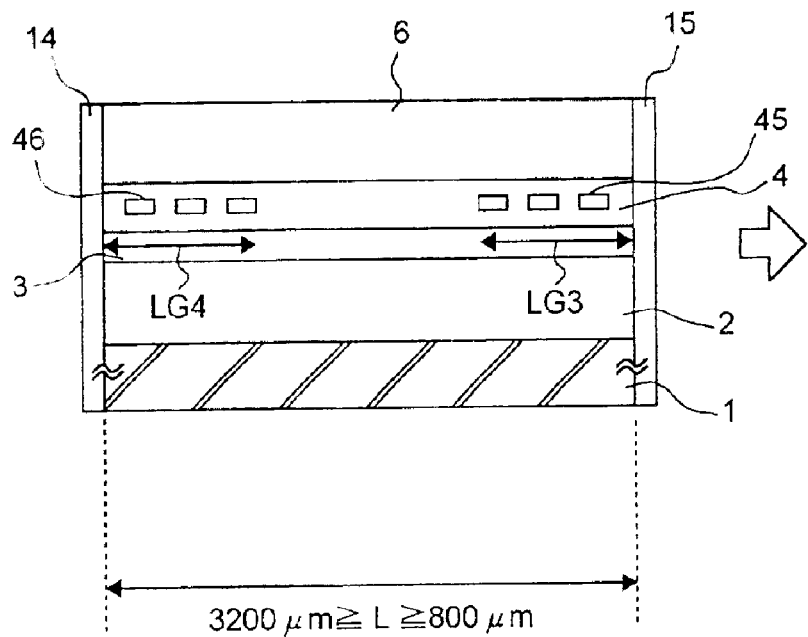
FIG. 6 is a vertical sectional view in the longitudinal direction of a semiconductor laser device having a partial diffraction grating on either or both the light reflecting side and the light emitting side of the device in accordance with the present invention.
FIG. 7 is a table showing the output powers for pumping light sources in a bi-directional and a backward pumped Raman amplifier for various wavelength systems using a conventional FBG pump module.

While the laser device 51 has been described with respect to a full grating structure, a partial grating structure positioned on either or both of the light emitting side and the light reflecting side of the semiconductor laser device may be used. FIG. 6 is a multiple mode semiconductor laser device illustrating the various configurations of a partial grating to provide multiple longitudinal modes within the wavelength oscillating spectrum. As seen in this figure, partial grating 45 may be positioned on the light emitting side of the laser device. In this configuration, it is preferable that the diffraction grating length Lg3 and the resonator length L are set to satisfy the relationship Lg×(1300 μm/L) ≦300 μm. Moreover, the diffraction grating 45 is preferably constructed such that a value obtained by multiplying a coupling coefficient κ of the diffraction grating by a diffraction grating length Lg3 is set to 0.3 or less. By setting these parameters, multimode operation of the laser device having a diffraction grating on a light emitting side can be achieved. Examples of devices having a diffraction grating provided in the vicinity of the radiation side reflecting film may be found in U.S. patent application Ser. No. 09/983,249, which is incorporated herein by reference.

The partial grating 46 positioned on the light reflecting side of the laser device preferable has a grating length Lg4 and the resonator length L are set to satisfy the relationship Lg≦½L. Moreover, the diffraction grating 46 is preferably constructed such that a value obtained by multiplying a coupling coefficient κ of the diffraction grating by a diffraction grating length Lg4 is set to 1 or more, and selectively returns light to the radiation side by the effective reflectivity of the diffraction grating being 98% or higher. By setting these parameters, multimode operation of the laser device having a diffraction grating on a light reflecting side can be achieved. Examples of devices having a diffraction grating provided in the vicinity of the radiation side reflecting film may be found in U.S. patent application Ser. No. 09/983, 175, which is incorporated herein by reference. Of course, the laser device may have a diffraction grating on both the light reflecting side and the light emitting side of the device as shown in FIG. 6.

In each of the embodiments described above, the periodically spaced material of the diffraction grating 13 is equally spaced and has a constant pitch. However, it is to be understood that the grating material may have different spacings and pitches in order to achieve the desired multiple oscillation modes from the laser device. Examples of such a chirped grating are disclosed in the U.S. Patent Applications incorporated above.

As described in the background section above, integrated diffraction grating pump laser modules used in a forward excitation cause undesirable SBS to occur. The present inventors have recognized that the SBS may be avoided by reducing the output power of the integrated diffraction grating laser device. Specifically, where forward excitation is used in combination with backward excitation in a bi-directional excitation Raman amplifier, the output power of the forward pump light source must be significantly lower than the output power of the reverse pump light source so that SBS will be avoided. FIG. 7 is a table showing the output powers for pumping light sources in a bi-directional and a backward pumped Raman amplifier for various wavelength systems using an integrated grating device. As seen in this figure, for the forward excitation light source, a relatively small optical output of 22 mW to 36 mW is used, while the backward power is 65 mW to 206 mW.

Figure 8A:
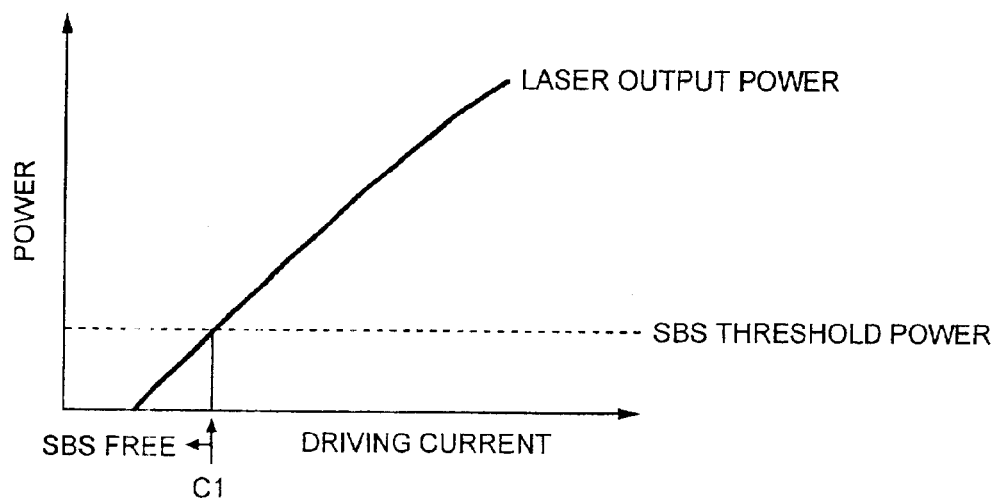
FIG. 8A is a graph of an I-L curve showing the output power of a single mode laser as a function of the driving current of the laser.
Figure 8B:
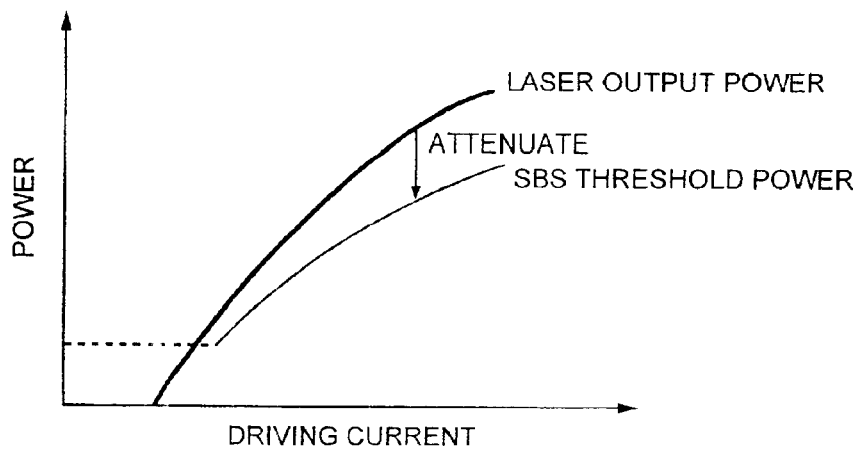
FIG. 8B is an I-L curve showing the laser output power and SBS threshold power of an integrated grating multiple mode laser device as the drive current of such device is increased.

One known method of reducing the output power in order to avoid SBS is to reduce the injection current of the semiconductor laser device. The present inventors have discovered, however, that although reducing the drive current is effective for avoiding the SBS effect of a single mode laser, this method is ineffective for avoiding SBS in a multiple mode integrated diffraction grating laser device. FIG. 8A is a graph showing the output power of a single mode laser as a function of the driving current of the laser (I-L curve). As seen in this figure, a dashed line represents the SBS threshold power for the single mode laser device. It is clear from the graph that SBS free laser operation can be achieved when a driving current is less than C1. FIG. 8B is an I-L curve showing the laser output power and SBS threshold power of an integrated grating multiple mode laser device as the drive current of such device is increased. As seen in this figure, the increasing output power curve of the laser device is higher than and roughly parallel to the increasing SBS threshold curve. While a decrease in drive current results in a decrease in output power, a corresponding decrease in the SBS threshold prevents the output power from dropping below the SBS threshold. Thus, the present inventors discovered that, unlike single mode laser modules, a reduction in drive current of an integrated grating multiple mode laser device is not effective to avoid SBS.

Moreover, the present inventors have realized that decreasing the drive current of an integrated diffraction grating device such as that disclosed in FIGS. 2–4 and 6 causes an undesireable increase in relative intensity noise (RIN). FIG. 9 is a graph showing an RIN characteristic of a conventional FBG module and the semiconductor laser module according to the first embodiment at different drive currents. In FIG. 9, reference symbol G0 indicates an RIN characteristic of a conventional semiconductor laser module having an FBG, while reference symbols G1, G2, and G3 denote RIN characteristics obtained when the drive currents of the semiconductor laser device 51 are 50 mA, 100 mA, and 300 mA, respectively. As is apparent from the graph, the semiconductor laser module 50 exhibits an RIN characteristic which is preferable to that of the conventional semiconductor laser module having an FBG. Moreover, when the drive currents are 50 mA and 100 mA, RIN is deteriorated by the influence of relaxation oscillation of the laser. For this reason, in order to obtain preferable RIN, the drive current of the laser device 5 should be 150 mA or more. More generally, in the semiconductor laser module according to the first embodiment, a drive current preferably exceeds at least 50 mA, more preferably 100 mA, still more preferably 150 mA or more. Therefore, the influence of relaxation oscillation of the laser by the RIN can be almost neglected, and a low-noise laser beam can be emitted.

Figure 10B:
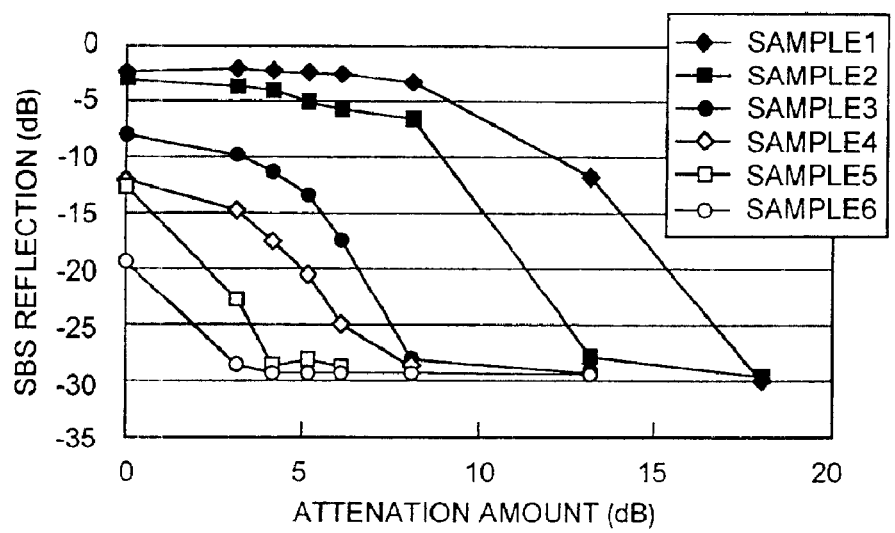
FIG. 10B is a graph showing the SBS reflection as a function of attenuation amount for 6 sample integrated diffraction grating devices.
Figure 10C:
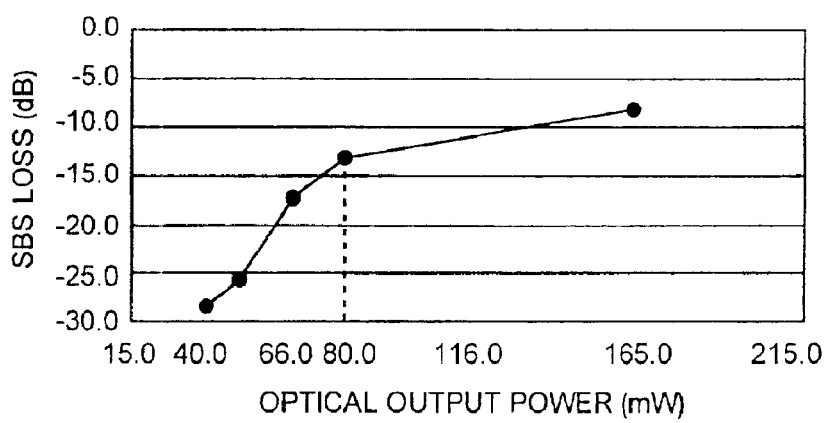
FIG. 10C is a graph showing the effect of attenuation on SBS loss by plotting SBS loss against output power.

While decreasing drive current is ineffective for avoiding SBS and actually causes undesirable RIN with a multiple mode integrated grating laser device, the present inventors have discovered that SBS can be avoided by attenuating the light output of a integrated grating multiple mode laser device prior to the light being introduced as a pump light into the signal fiber. Specifically, the present inventors conducted experiments to determine what effect of attenuation of an integrated grating laser output has on SBS. FIG. 10A is a block diagram showing the test setup used by the present inventors. As seen in this figure, the output of an integrated grating multiple mode laser device 1000 is input into an optical attenuator 1010. The output of the optical attenuator is fed into a 20 dB coupler 1020, which is connected to a reflection power monitor 1030, an input power monitor 1040, and a 55 km dispersion shift fiber (DSF) 1050. The output of the DSF 1050 is fed to a fiber output monitor 1060. FIG. 10B is a graph showing the SBS reflection as a function of attenuation amount for 6 sample integrated diffraction grating devices. As seen in this figure, as the attenuation level is increased, the SBS level is reduced. FIG. 10C shows the effect of attenuation on SBS loss by plotting SBS loss against optical output power. As seen in FIG. 10C, if optical output power of an integrated grating laser module is decreased from 80 mW to 40 mW, SBS loss decreases from −13 dB to −28 dB.

As described with respect to FIG. 1 above, the first embodiment of the present invention achieves attenuation by offsetting the optical center of the second lens 54 from the optical axis of the laser beam emitted from the semiconductor laser device 51 through the first lens 52 and the isolator 53 in any one of directions X, Y, and Z shown in FIG. 1. The direction X indicates the direction of height (upper and lower directions on the plane of the drawing) of the semiconductor laser module 50, while the direction Y indicates the directions of width (vertical direction of the plane of the drawing) of the semiconductor laser module 50 and the direction Z indicates the longitudinal direction (horizontal direction on the plane of the drawing) of the semiconductor laser module 50. More specifically, the semiconductor laser module 50 intentionally performs so-called defocusing so that the optical coupling efficiency between the second lens 54 and the optical fiber 55 is intentionally decreased. From the viewpoint of coupling reliability, since a tolerance in the direction Z with respect to a coupling offset is large, and the coupling is preferably offset in this direction. That is, for improved coupling reliability, it is preferable that the off set is achieved in the Z direction shown in FIG. 1.

By the defocusing, even though a sufficiently large drive current is applied to the semiconductor laser device 51, a laser beam having an intensity lower than the intensity of a laser beam emitted from the semiconductor laser device 51 is propagated in the optical fiber 55 optically coupled to the second lens 54.

Therefore, the semiconductor laser module can output a laser beam having a low intensity despite the drive current of the semiconductor laser device 51 being relatively high. As described above, an optimum condition of an excitation light source for a forward excitation system is a low optical output to prevent SBS and a high driving current to prevent RIN. Therefore, the semiconductor laser module of the first embodiment of the present invention is optimum as an excitation light source for a forward excitation system.

Figure 11:
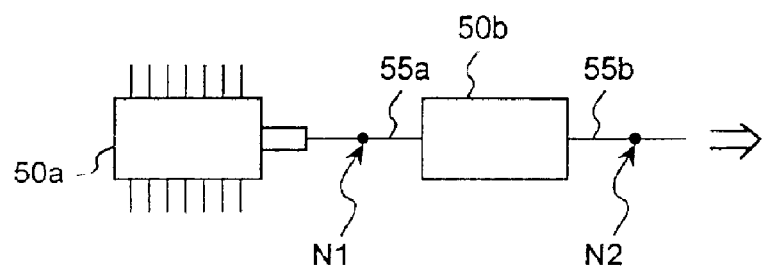
FIG. 11 is a block diagram showing a configuration of a semiconductor laser module according to a second embodiment of the present invention.

FIG. 11 is a block diagram showing a configuration of a semiconductor laser module according to a second embodiment of the present invention. As seen in this figure, a laser module 50*a* is provided with an output connected to an optical fiber 55*a*. The optical fiber 55*a* is input to an optical attenuator module 50*b*, the output of which is connected to a second fiber 55*b*. Unlike the semiconductor laser module 50 described in the first embodiment, the laser module 50*a* does not have an offset lens for achieving defocusing. That is, the output lens of the module 50*a* is provided at the optimum position to achieve high output power from the module 50*a*. Attenuation is achieved in the second embodiment by the external attenuator 50*b*.

Figure 12:
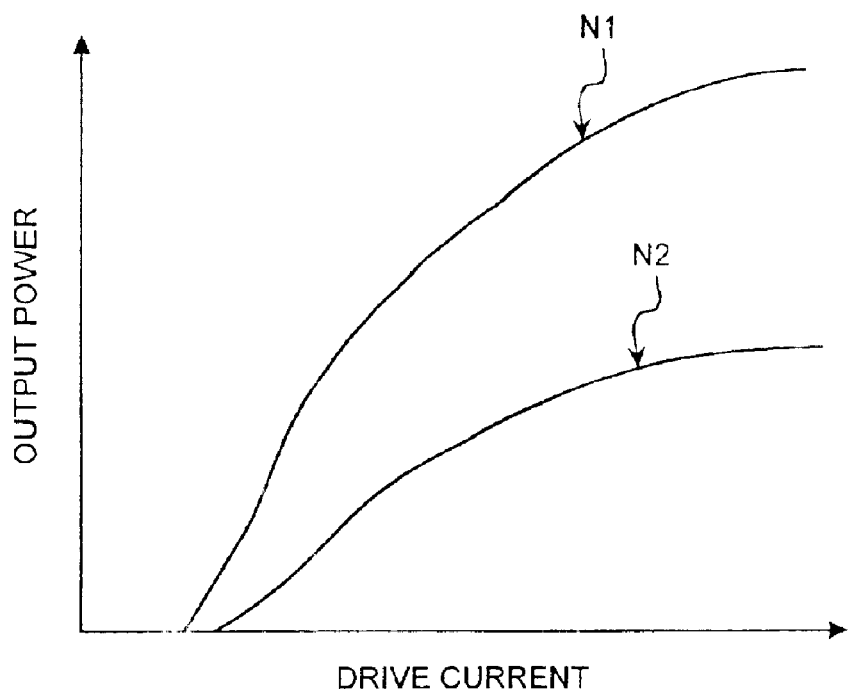
FIG. 12 is a graph plotting output power against drive current at a node N1 and a node N2 in FIG. 11.

More specifically, the output power of a laser beam output from the semiconductor laser module 50*a* is attenuated by the optical attenuater 50*b*, and an attenuated result contributes as excitation light of a Raman amplifier. FIG. 12 is a graph showing the output power plotted against the drive current at a node N1 and a node N2 in FIG. 11. As shown in FIG. 12, the laser beam passing through the optical attenuater 50*b* has a value which is sufficiently smaller than that of the laser beam which does not pass through the optical attenuater 50*b*, and can be used as excitation light for forward excitation as previously described. Thus, as with the first embodiment, the laser module 50*a* with attenuater 50*b* can be operated at a high drive current to reduce RIN and a low output power to avoid SBS.

Figure 13:
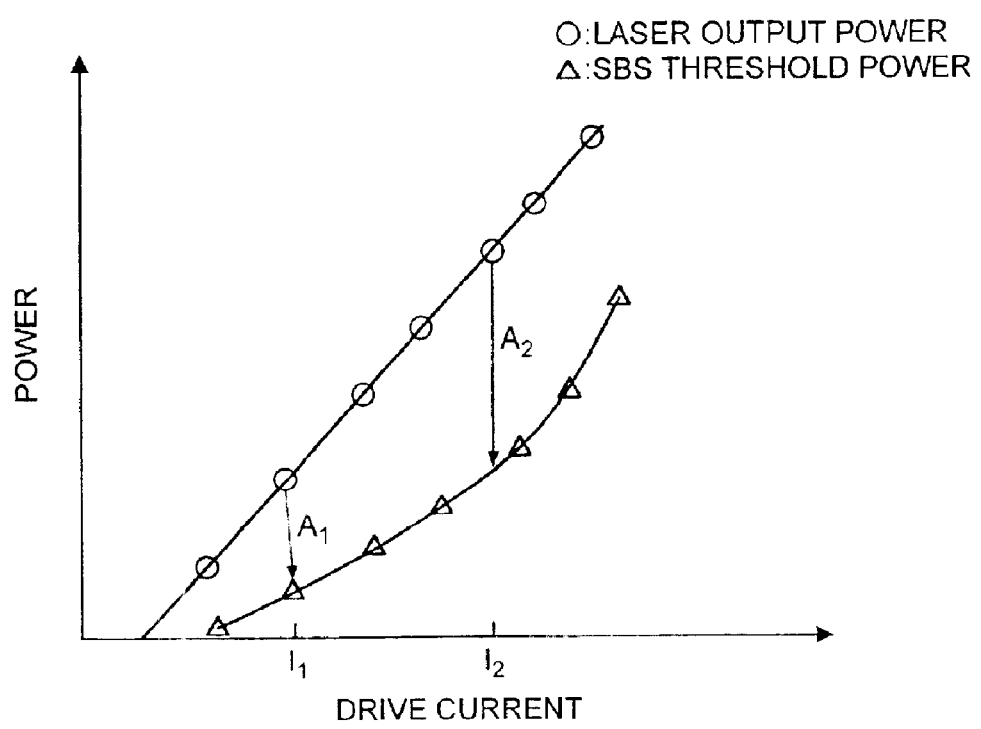
FIG. 13 is a graph showing the principle of attenuating the laser module light output based on the drive current of the laser device in the laser module.

As noted with respect to FIG. 8B, the present inventors have discovered that the SBS threshold for a laser module having an integrated diffraction grating laser device changes as the drive current of the laser device changes. Thus, in a preferred embodiment of the laser module of the present invention, the amount of attenuation of the laser module is set in accordance with the drive current in the integrated grating laser device. FIG. 13 is a graph showing the principle of attenuating the laser module light output based on the drive current of the laser device in the laser module. As seen in FIG. 13, when the laser is operated at current $I_1$, an attenuation greater than $A_1$ is sufficient to avoid SBS, while an attenuation $A_2$ is required to avoid SBS when the laser is operated at current $I_2$. Thus, based on the present inventors' discovery that SBS threshold varies with changes in drive current, the amount of attenuation for a particular drive current of a particular laser device can be determined by trial and error experimentation. By only attenuating the output power by an amount necessary to avoid SBS for a particular drive current, efficient use of power can be achieved.

While the laser modules detailed above have been described with respect to a semiconductor laser device having a resonator length L of 800 µm–3200 µm, a semiconductor laser module of the present invention may include a laser device having a length L that is smaller than 800 µm. When the resonator length L is larger than 800 µm, as described above, a mode interval Δλ between the oscillation longitudinal modes becomes small. However, since an output in forward excitation may be relatively smaller than an output in backward excitation, the resonator length L need not be 800 µm or more. Such a configuration of the laser device provides yet another way of reducing the output of the laser module to avoid SBS, while maintaining a high driving current to reduce RIN.

Figure 14:
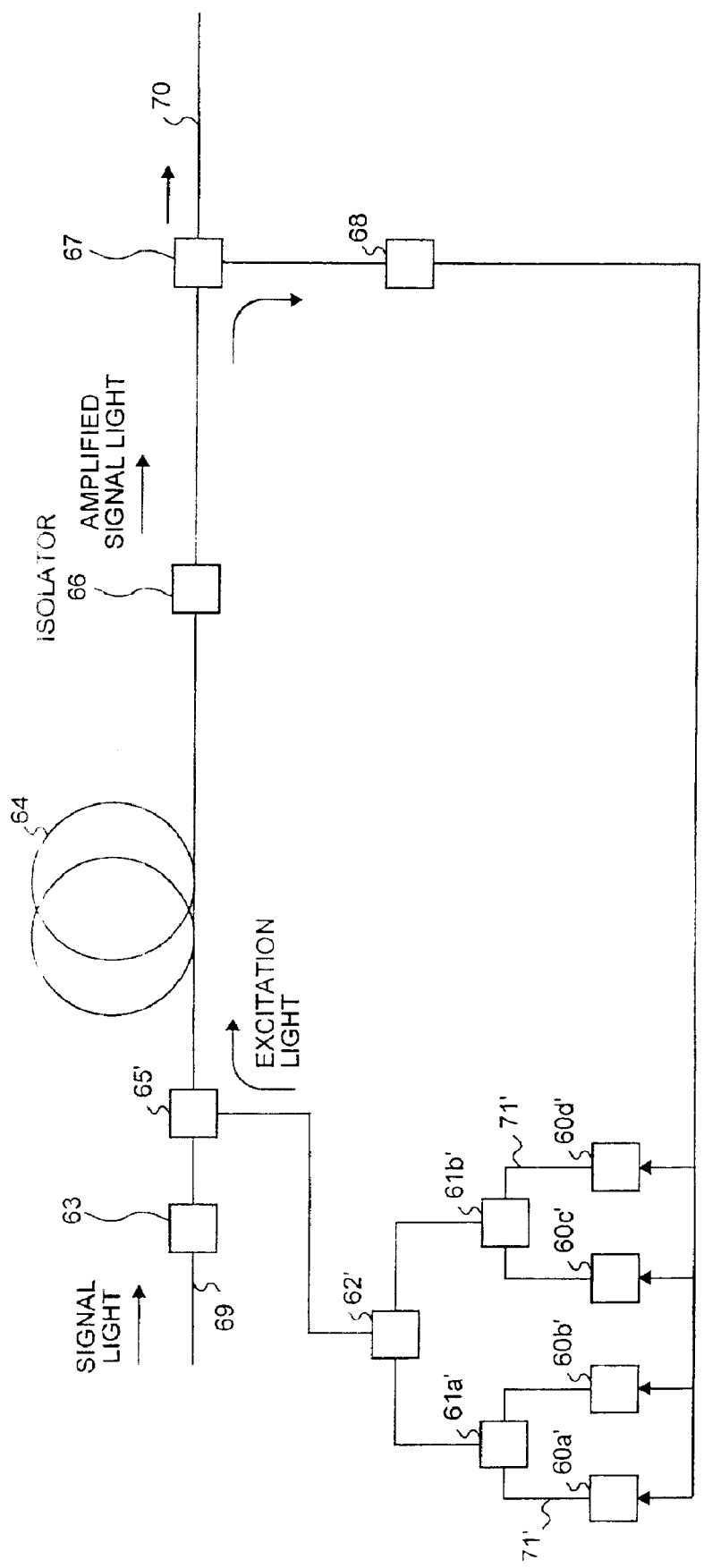
FIG. 14 is a block diagram illustrating a configuration of a Raman amplifier used in a WDM communication system in accordance with the present invention.

FIG. 14 is a diagram of a forward pumped Raman amplifier using a semiconductor laser module in accordance with the present invention. In FIG. 14, semiconductor laser modules 60*a*' through 60*d*' are of the type described in the embodiment of FIG. 1 or FIG. 11. The laser modules 60*a*' and 60*b*' output laser beams having the same wavelength via polarization maintaining fiber 71' to polarization-multiplexing coupler. Similarly, laser beams outputted by each of the semiconductor laser modules 60*c*' and 60*d*' have the same wavelength, and they are polarization-multiplexed by the polarization-multiplexing coupler 61*b*'. Each of the laser modules 60*a*' through 60*d*' outputs a laser beam having a plurality of oscillation longitudinal modes in accordance with the present invention to a respective polarization-multiplexing coupler 61a' and 61b' via a polarization maintaining fiber 71'.

Polarization-multiplexing couplers 61a' and 61b' output polarization-multiplexed laser beams having different wavelengths to a WDM coupler 62'. The WDM coupler 62' multiplexes the laser beams outputted from the polarization multiplexing couplers 61a' and 61b', and outputs the multiplexed light beams as a pumping light beam to amplifying fiber 64 via WDM coupler 65'. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light outputs as an output laser beam to signal light outputting fiber 70.

The control circuit 68 controls a light-emitting state, for example, an optical intensity, of each of the semiconductor laser module 60a' through 60d' based on the portion of the amplified signal light beams input to the control circuit 68. This optical intensity of the Raman amplifier output is used along with the monitor current photodiode 56 of the laser module in FIG. 21 to control the output of the semiconductor lasers of each module. Thus, control circuit 68 performs feedback control of a gain band of the Raman amplification such that the gain band will be flat over wavelength.

Figure 15:
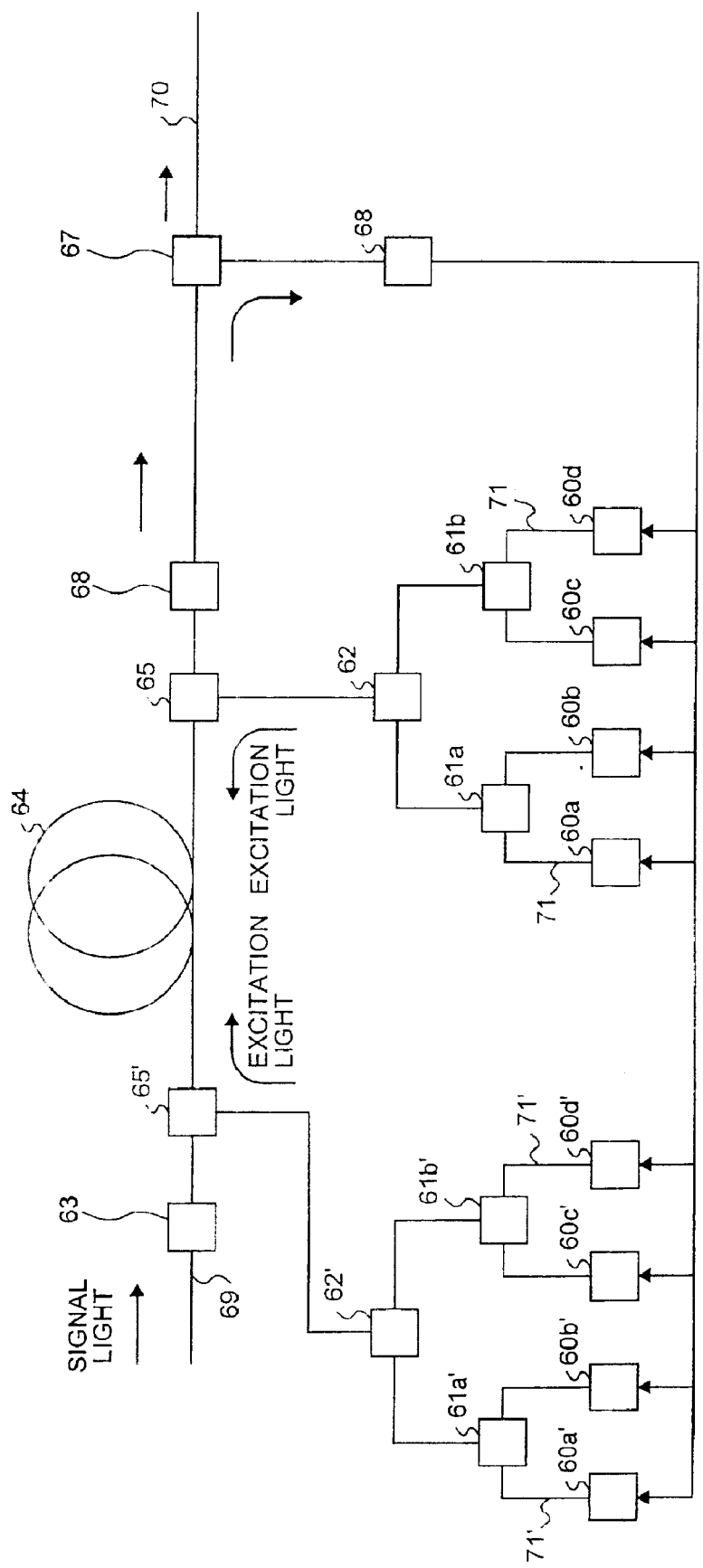
FIG. 15 is a block diagram illustrating a configuration of the Raman amplifier of FIG. 14, used in a WDM communication system in a bi-directional pumping method in accordance with the present invention.
Figure 16:
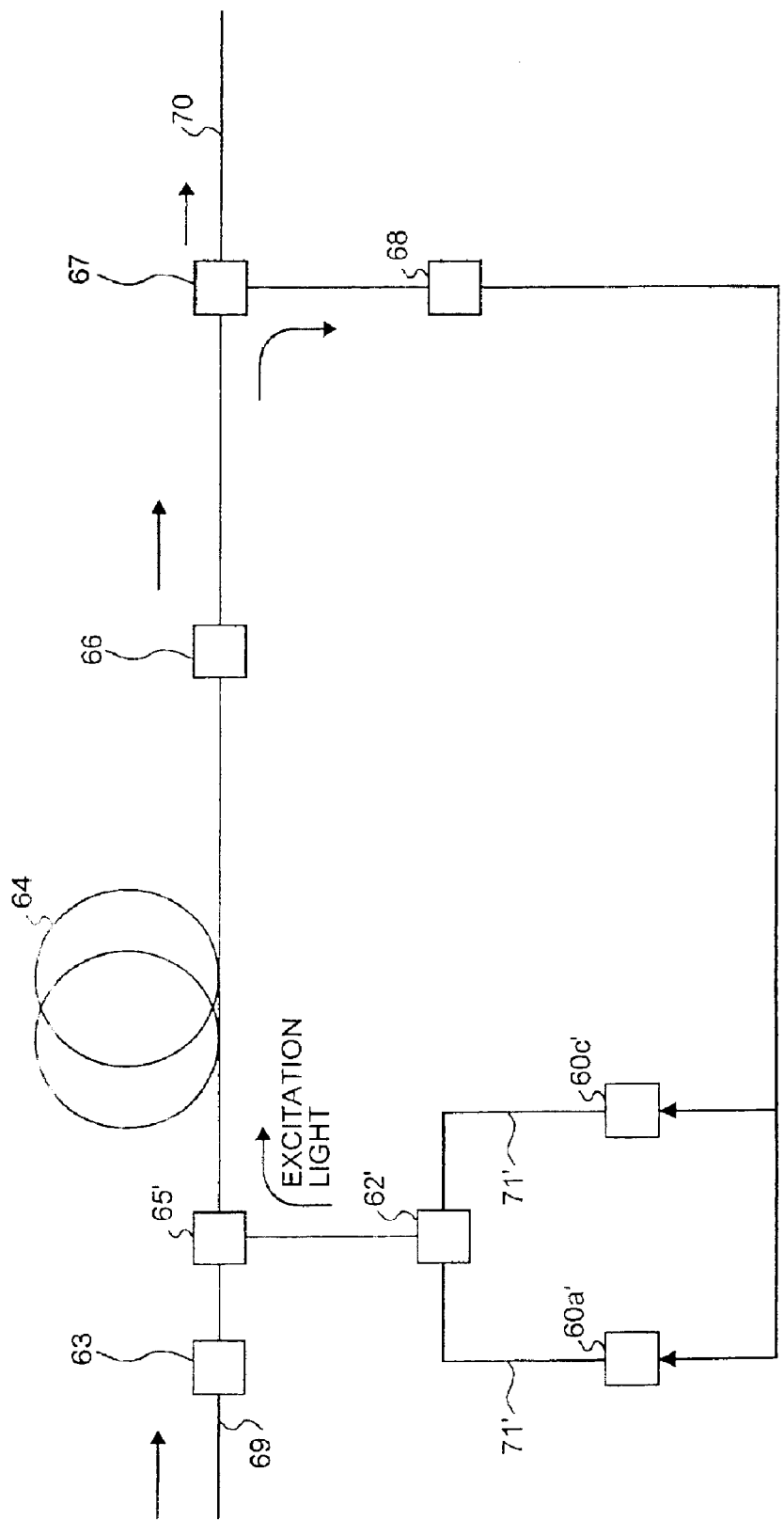
FIG. 16 is a block diagram illustrating a configuration of a Raman amplifier in which polarization dependent gain is suppressed by depolarizing a pumping light beam output from a single semiconductor laser device using polarization maintaining fibers as a depolarizer, in accordance with an embodiment of the present invention.
Figure 17:
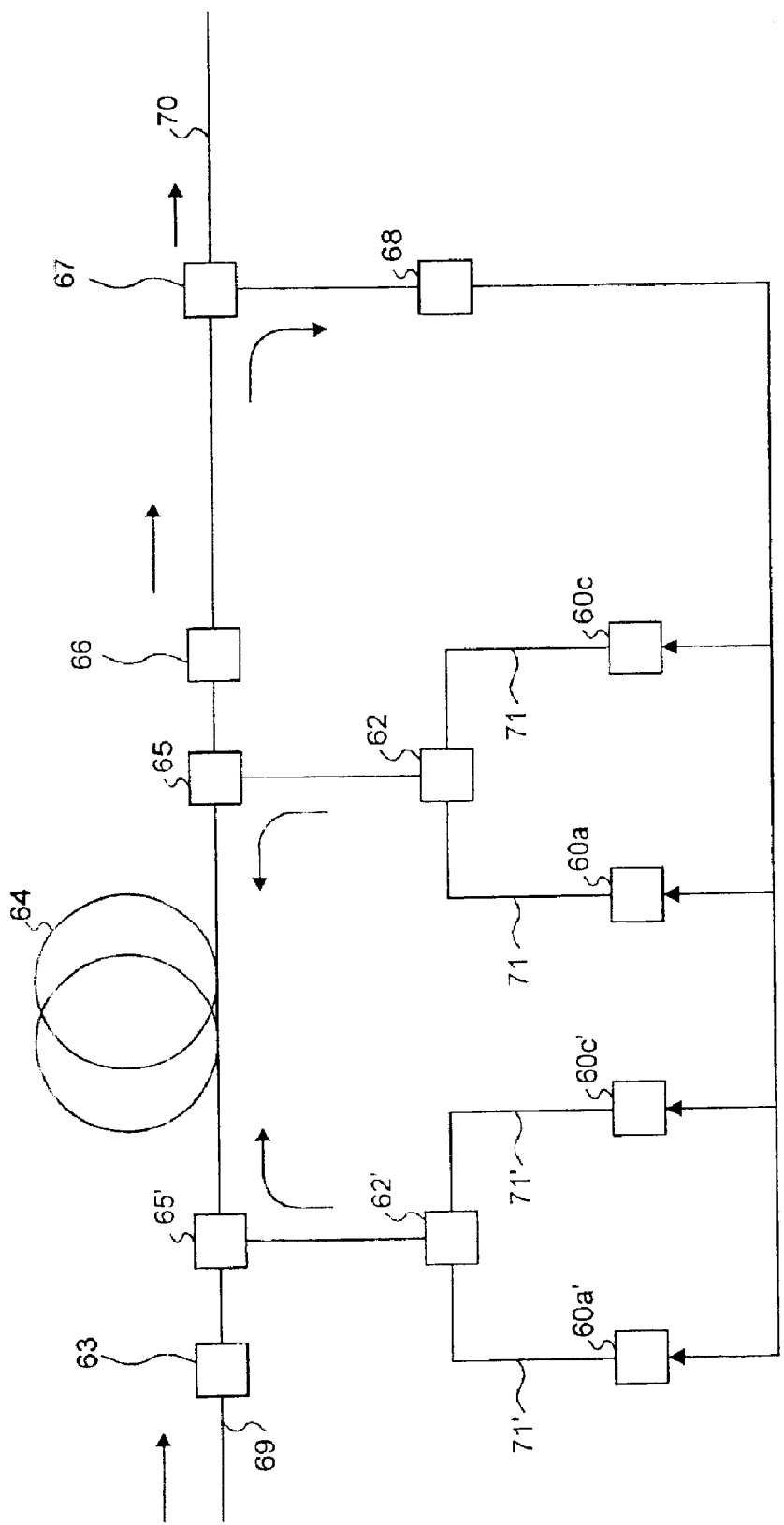
FIG. 17 is a block diagram illustrating a configuration of the Raman amplifier used in a WDM communication system in a bidirectional pumping method in accordance with the present invention.

Although the Raman amplifier illustrated in FIG. 14 is the forward pumping method, it is to be understood that the semiconductor laser module and Raman amplifier of the present invention may be used with bi-directional pumping method as shown in FIG. 15. Moreover, the Raman amplifier can be constructed by wavelength-multiplexing of a plurality of pumping light sources which are not polarization-multiplexed. That is, the semiconductor laser module of the present invention can be used in a Raman amplifier where the polarization-multiplexing of pumping light is not performed. FIG. 16 is a block diagram illustrating a configuration of a Raman amplifier in which polarization dependent gain is canceled by depolarizing a pumping light beam output from a single semiconductor laser device using polarization maintaining fibers as a depolarizer, in accordance with an embodiment of the present invention. As seen in this figure, laser modules 60a' and 60c' are directly connected to WDM coupler 62' via a polarization maintaining fiber 71'. In this configuration, the angle of the polarization axis of the polarization maintaining fiber against the emitted light from semiconductor laser device is approximately 45 degrees. Finally, it is to be understood that the semiconductor laser device, module and Raman amplifier of the present invention shown in FIG. 16 may be used with bi-directional pumping method as shown in FIG. 17.

Figure 18:
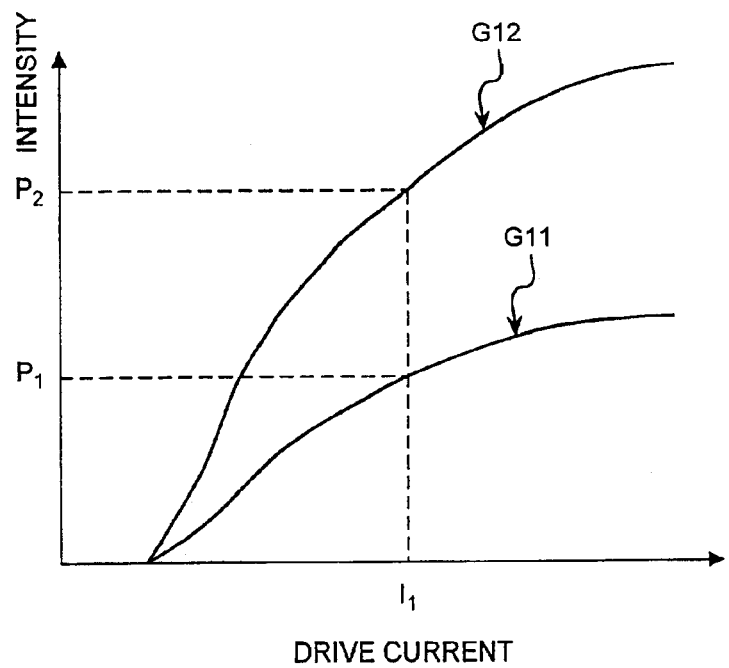
FIG. 18 is a graph showing the drive current plotted against laser beam intensity in the forward excitation laser module and the backward excitation laser module respectively, of a bi-directional pumped Raman amplifier in accordance with the present invention.

FIG. 18 is a graph showing the relationships between drive currents and laser beam intensities in the semiconductor laser modules 60a' to 60d' used in forward excitation and the semiconductor laser modules 60a to 60d used in backward excitation. In FIG. 18, reference symbol G11 indicates the characteristics of the semiconductor laser modules 60a' to 60d' used in forward excitation, and reference symbol G11 indicates the characteristics of the semiconductor laser modules 60a to 60d used in backward excitation. As shown in FIG. 18, in comparison with the same drive current, the intensity $P_1$ of the semiconductor laser modules 60a' to 60d' used in forward excitation lower than the intensity $P_2$ used in a backward excitation method.

Figure 19A:
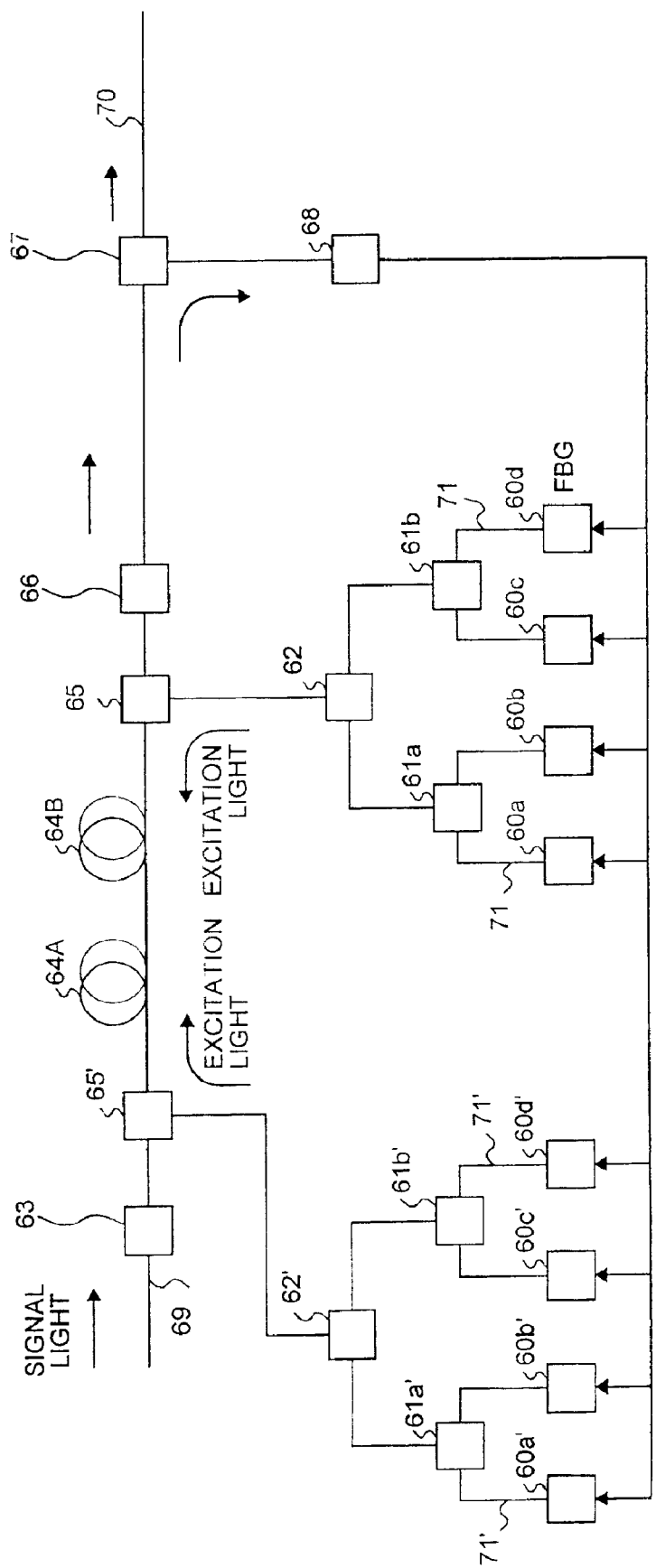
FIG. 19A is a block diagram illustrating a configuration of a two amplifying fiber Raman amplifier used in a WDM communication system in accordance with another embodiment of the present invention.

FIG. 19A is a block diagram of a Raman amplifier in a bidirectional configuration according to another embodiment of the present invention. The Raman amplifier of the embodiment of FIG. 19A is similar to the Raman amplifier shown in FIG. 15, except for the configuration of the amplifying fiber. As seen in FIG. 19A, the amplifying fiber includes a first fiber 64A and a second fiber 64B. The first fiber is a 33 km super large area (SLA) fiber having a low nonlinearity characteristic, while the second fiber 64B is a 33 km inverse dispersion fiber (IDF) having a large nonlinearity characteristic.

As discussed above, the forward excitation light is more susceptible to nonlinear characteristics such as SBS. Therefore, the fiber 64A provides amplification of the signal based primarily on the forward excitation light, while the fiber 64B provides amplification based primarily on the backward excitation light. With this configuration, SBS in the forward pumping direction is suppressed by the SLA fiber 64A, which has a high SBS threshold due to the low nonlinearity. In addition, the IDF fiber 64B compensates for any dispersion that occurs in the SLA fiber. While the IDF fiber 64B has a relatively low SBS threshold due to its large nonlinearity characteristic, this is less of a problem because the backward excitation light is less susceptible to SBS. Moreover, the length of the SLA fiber 64A may be selected such that the forward excitation light is sufficiently attenuated at the exit of the fiber 64A that the power level of the forward excitation light is below the SBS threshold of the IDF fiber 64B. For example, if the loss of the SLA fiber is 0.188 dB/km, then the total loss of the SLA is about 6 dB (0.188 dB/km*33 km=6 dB).

In the Raman amplifier of FIG. 19A, the semiconductor laser modules 60a' to 60d' may include an attenuation mechanism such as the offset optical lens or attenuator discussed above, or may provided an unattenuated pumping source. That is, the SLA fiber 64A may be used as the only mechanism in the Raman amplifier for suppressing SBS, or may be used in conjunction with attenuation mechanisms associated provided at the pumping module level. Moreover, while FIG. 19A shows a Raman amplifier in which the pumping light sources are polarization-multiplexed, the fibers 64A and 64B can be used in a Raman amplifier where the polarization-multiplexing of pumping light is not performed, similar to the configuration shown in FIG. 16.

In the embodiment of FIG. 19A, the semiconductor laser modules 60a' to 60d' include integrated diffraction grating multiple mode lasers to pump the SLA fiber, while the semiconductor laser modules 60a to 60d include Fiber Bragg grating lasers to pump the IDF fiber. However, other configurations of the amplification fiber are also possible in accordance with the present invention.

FIG. 19B shows a conventional three amplifying fiber configuration. As seen in this Figure, SLA fibers 64A and 64C and an IDF fiber 64B are arranged between a forward pump module and a backward pump module in a Raman amplifier with a bi-directional pumping method. In this arrangement, the IDF fiber 64B is disposed between the SLA fibers 64A and 64C and the forward pump module 1930 includes Fabry Perot lasers and the backward pump module 1910 includes FP lasers having a fiber Bragg grating.

Figure 19C:
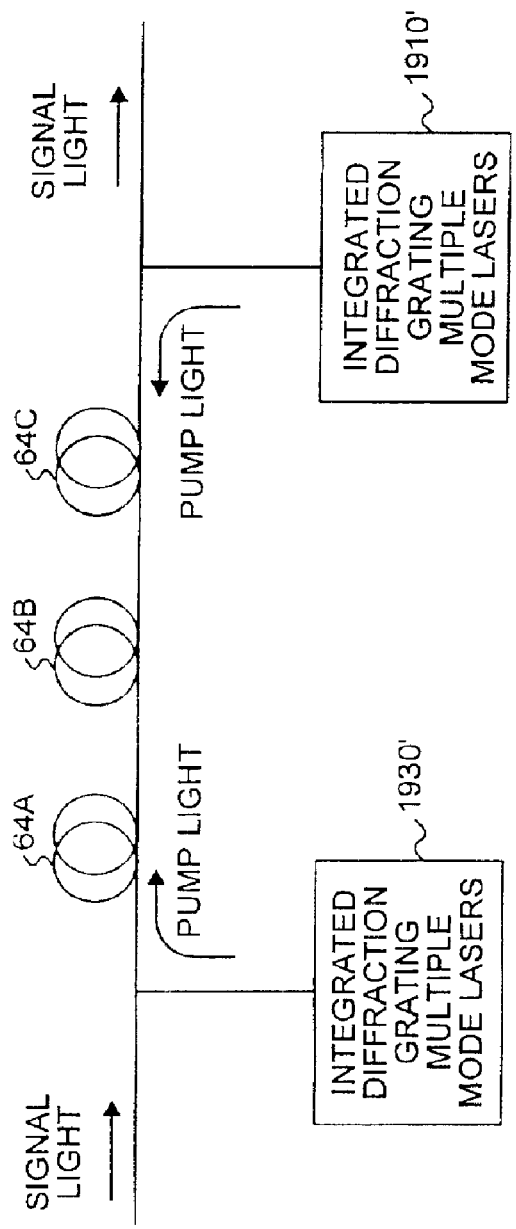
FIGS. 19C and 19D are block diagrams illustrating configuration of a three amplifying fiber Raman amplifier used in a WDM communication system in accordance with embodiments of the present invention.
Figure 19D:
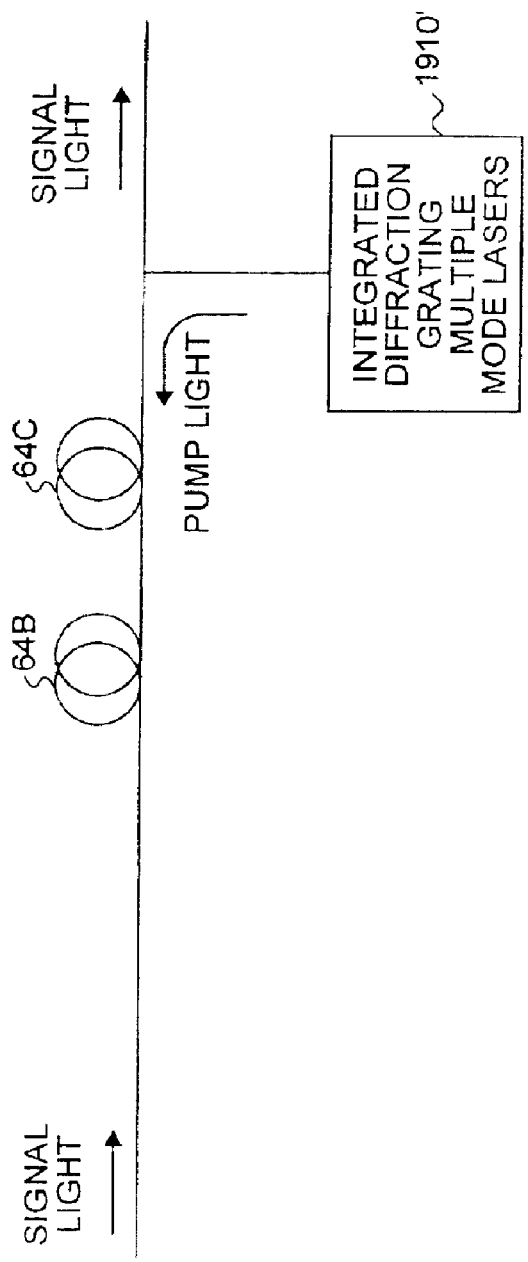
Figure 19E:
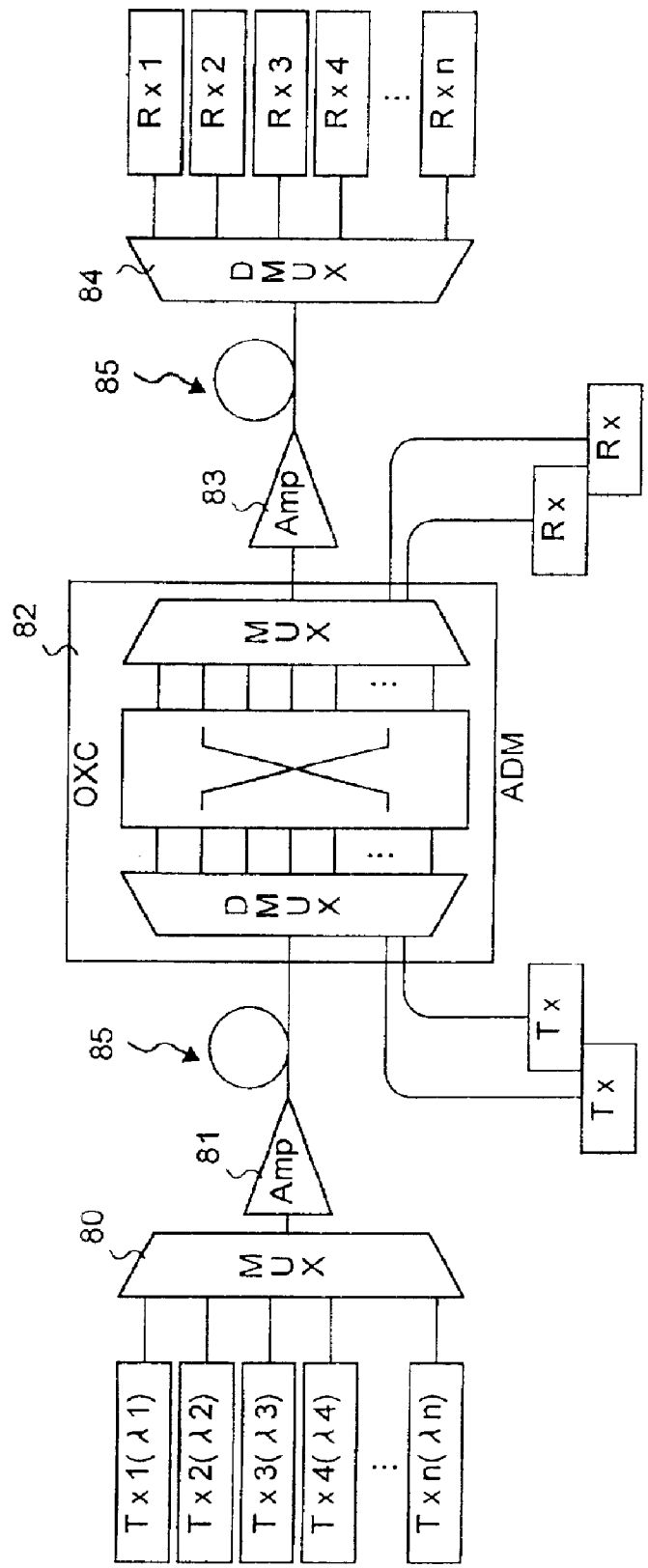
FIG. 19E is a block diagram illustrating a general configuration of the WDM communication system to which the Raman amplifier shown in any of FIGS. 14–17 and 19 is applied.

The present inventors have recognized that for the arrangement described in FIG. 19b, the SBS can be further lowered and the RIN may be improved if the forward pump module 1930 and the backward pump module 1910 include integrated diffraction grating multiple mode lasers. FIGS. 19C and 19D are block diagrams of a Raman amplifier having an integrated diffraction grating laser as a pumping source. In FIG. 19C, SLA fibers 64A and 64C and an IDF fiber 64B are arranged between a forward pump module as described in FIG. 19B. However, the forward pump module 1930' and the backward pump module 1910' each include diffraction grating multiple mode lasers. In the embodiment shown in FIG. 19D, an IDF fiber 64B is disposed on the input signal light side of the arrangement and an SLA fiber 64C is disposed on the backward pump module 1910 side. As seen in this figure, there is no forward pump module in this configuration, and the backward pump module 1910' includes integrated diffraction grating multiple mode lasers. Moreover, while FIGS. 19C to 19E do not show how the pumping light sources are connected, it is understood that either of the arrangements described in FIGS. 15 and 16 can be used.

As with the Raman amplifier of FIG. 19A, the integrated grating multiple mode lasers of FIGS. 19C and 19D may include an attenuation mechanism such as the offset optical lens or attenuator discussed above, or may provided an unattenuated pumping source. That is, the SLA fiber 64A may be used as the only mechanism in the Raman amplifier for suppressing SBS, or may be used in conjunction with attenuation mechanisms associated provided at the pumping module level. Moreover, the Raman amplifier in FIGS. 19C and 19D may include pumping light sources that are polarization-multiplexed, or may be a Raman amplifier where the polarization-multiplexing of pumping light is not performed, similar to the configuration shown in FIG. 16.

The Raman amplifier illustrated in FIGS. 14–17 and 19A–D can be applied to the WDM communication system as described above. FIG. 19B is a block diagram illustrating a general configuration of the WDM communication system to which the Raman amplifier shown in any of FIGS. 14–17 and 19A is applied.

In FIG. 19B, optical signals of wavelengths $\lambda_1$ through $\lambda_n$ are forwarded from a plurality of transmitters $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIGS. 15–17 and 19A are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A semiconductor laser module comprising:
   a semiconductor laser device having an integrated diffraction grating and
   configured to output a multiple mode laser beam in the presence of a driving current;
   an optical fiber configured to guide the multiple mode laser beam to an output of said laser module; and
   an optical attenuation device configured to attenuate said multiple mode laser beam by an amount sufficient to provide a predetermined output power from said output of the laser module,
   wherein said optical attenuation device comprises an optical coupling lens offset from an optimum coupling position by an amount sufficient to provide said predetermined output power.

2. The semiconductor laser module of claim 1, wherein said optical coupling lens is a lens offset from the optimum coupling position in at least one of a direction of an optical axis of the laser beam and a direction perpendicular to said optical axis.

3. The semiconductor laser module of claim 2, wherein said coupling lens comprises a lens substantially offset from the optimum coupling position only in a direction of the optical axis.

4. The semiconductor laser module of claim 1, wherein said semiconductor laser device comprises a laser with said driving current being at least 50 mA.

5. The semiconductor laser module of claim 1, wherein said semiconductor laser device comprises a laser with said driving current being at least 100 mA.

6. The semiconductor laser module of claim 1, wherein said semiconductor laser device comprises a laser with said driving current being at least 150 mA.

7. The semiconductor laser module of claim 1, wherein
   said semiconductor laser device comprises a laser with said driving current being a predetermined current sufficient to reduce relative intensity noise (RIN) of said laser module; and
   said optical attenuation device comprises a device configured to attenuate said multiple mode laser beam by an attenuation amount sufficient to provide said predetermined output power at a power level that is sufficient to avoid stimulated Brillouin scattering (SBS) in a signal fiber that the output power is injected into.

8. A method for providing light from a semiconductor laser module comprising:
   providing a driving current to a semiconductor laser device having an integrated diffraction grating so as to emit a multiple mode laser beam;
   providing an optical fiber for guiding the multiple mode laser beam to an output of said laser module; and
   providing an optical attenuating device for attenuating said multiple mode laser beam by an amount sufficient to provide a predetermined output power from the output of said laser module,
   wherein said providing an optical attenuating device comprises providing an optical coupling lens offset from an optimum coupling position by an amount sufficient to provide said predetermined output power.

9. The method of claim 8, wherein said providing a driving current comprises providing a driving current of at least 50 mA to said semiconductor laser device.

10. The method of claim 8, wherein
    said providing a driving current comprises providing a predetermined driving current sufficient to reduce relative intensity noise (RIN) of said laser module; and
    providing an optical attenuation device comprises providing a device for attenuating said multiple mode laser beam by an attenuation amount sufficient to provide said predetermined output power at a power level that is sufficient to avoid stimulated Brillouin scattering (SBS) in a signal fiber that the output power is injected into.

11. An optical fiber amplifier comprising:

a semiconductor laser module comprising:

- a semiconductor laser device having an integrated diffraction grating and configured to output a multiple mode laser beam in the presence of a driving current,
- an optical fiber configured to guide the multiple mode laser beam to an output of said laser module, and an optical attenuation device configured to attenuate said multiple mode laser beam by an amount sufficient to provide a predetermined output power from said output of said laser module, wherein said optical attenuation device comprises an optical coupling lens offset from an optimum coupling position by an amount sufficient to provide said predetermined output power; and an amplifying fiber coupled to said optical fiber and configured to amplify a signal by using said output of said laser module as a forward excitation light.

12. A Raman amplifier comprising:

a semiconductor laser module comprising:

- a semiconductor laser device having an integrated diffraction grating and configured to output a multiple mode laser beam in the presence of a driving current,
- an optical fiber configured to guide the multiple mode laser beam to an output of said laser module, and
- an optical attenuation device configured to attenuate said multiple mode laser beam by an amount sufficient to provide a predetermined output power from said output of said laser module, wherein said optical attenuation device comprises an optical coupling lens offset from an optimum coupling position by an amount sufficient to provide said predetermined output power; and an amplifying fiber coupled to said optical fiber and configured to amplify a signal by using said output of said laser module as a forward excitation light.

13. A wavelength division multiplexing system comprising:

a transmission device configured to provide a plurality of optical signals having different wavelengths;

an optical fiber amplifier coupled to said transmission device and including a semiconductor laser module comprising:

- a semiconductor laser device having an integrated diffraction grating and configured to output a multiple mode laser beam in the presence of a driving current,
- an optical fiber configured to guide the multiple mode laser beam to an output of said laser module, and
- an optical attenuation device configured to attenuate said multiple mode laser beam by an amount sufficient to provide a predetermined output power from said output of said laser module, wherein said optical attenuation device comprises an optical coupling lens offset from an optimum coupling position by an amount sufficient to provide said predetermined output power; and a receiving device coupled to said optical fiber amplifier and configured to receive said plurality of optical signals having different wavelengths.

\* \* \* \* \*